United States Patent [19]

Dassow

[11] 4,412,268
[45] Oct. 25, 1983

[54] SAFETY SWITCH SYSTEM FOR INDUSTRIAL MACHINES

[75] Inventor: Edgar E. Dassow, West Bend, Wis.

[73] Assignee: Dart Industries Inc., Northbrook, Ill.

[21] Appl. No.: 307,905

[22] Filed: Oct. 2, 1981

[51] Int. Cl.³ .............................................. H01H 9/00
[52] U.S. Cl. .................................... 361/181; 361/189
[58] Field of Search ................ 361/181, 189; 307/113; 340/365 C; 200/DIG. 1

[56] References Cited

U.S. PATENT DOCUMENTS

| | | | |
|---|---|---|---|
| 3,483,437 | 12/1969 | Coyne | 361/181 |
| 3,641,410 | 2/1972 | Vogelsberg | 340/365 C |
| 3,805,085 | 4/1974 | Andrews | 361/189 X |
| 3,895,269 | 7/1975 | Geremia | 361/189 |
| 4,054,935 | 10/1977 | Ginsberg | 361/189 |
| 4,074,602 | 2/1978 | Brower | 361/189 X |
| 4,091,438 | 5/1978 | Olding | 361/189 |

*Primary Examiner*—Reinhard J. Eisenzopf
*Attorney, Agent, or Firm*—Gregory J. Mancuso

[57] ABSTRACT

A touch plate switch is used to energize an industrial machine. The switch is closed by mere contact of the touch plate by an operator's hand. No physical movement of the plate is required. As a consequence, the risk of the operator developing carpal tunnel syndrome is substantially eliminated. By providing two such touch plate switches for operating relay switches connected in series, both switches must be simultaneously operated to start the industrial machine. By separating the switches a distance sufficient to prevent operation of both switches by one hand, the operator must use both hands and thereby a further safety feature is realized in that one of the operator's hands will not be inadvertently damaged by the machine.

2 Claims, 3 Drawing Figures

SAFETY SWITCH SYSTEM FOR INDUSTRIAL MACHINES

FIELD OF THE INVENTION

This invention relates generally to switches and more particularly to improved touch plate switches used for energizing industrial machines.

BACKGROUND OF THE INVENTION

In manufacturing processes, particularly those involving production assembly lines, it is often necessary for an operator to turn on an industrial machine such as a punch press, welding device, or the like at given time intervals. Normally, these machines are energized by a pushbutton and in order to maintain certain type of machines in an energized state, it is necessary for an operator to maintain a physical pressure on the pushbutton to hold it closed. This back pressure on the button may be substantial and the operator will often have to use his fingers as well as thumb in applying a gripping action to provide sufficient thumb pressure on the button.

In such operations as the foregoing, an operator may turn an industrial machine on and off several hundred times during a single shift. It is not uncommon, as a consequence, for the operator to develop an afflication known as carpal tunnel syndrome. Essentially, the repetitive motion results in an enlargement of the tendons from the fingers and thumb within a protective sheath. As a consequence, there is pressure placed on nerves located adjacent to the sheath resulting in a tingling and numbness sensation of the thumb and the first three fingers. Essentially, the result is that the operator loses his grasping strength.

Many industrial machines are provided with two switches both of which must be operated in order to start the machine. These switches are physically separated by a distance such that the operator must use both hands or thumbs to actuate the same simultaneously. The purpose for such a dual switch arrangement is to provide a safety feature in that the operator cannot inadvertently damage one hand or arm while turning the machine on with the other. In other words, by requiring the use of both arms and hands to turn on the machine, the operator's arms cannot be damaged by the machine. In such instances where two switches are used, then the carpal tunnel syndrome could develop in both hands of an operator.

While it is known in the prior art to provide switches for industrial equipment at spaced locations so as to meet the safety feature of requiring both hands of the operator to energize the equipment as mentioned above, and further while switches can be designed to operate relays which will ease the back pressure on a switch button, there has not been available any really effective solution to the carpal tunnel syndrom development in workers who operate such machines.

Examples of separated switches for safety purposes and relay operated switches are shown in prior U.S. Pat. Nos. 4,074,602 and 4,054,935 respectively.

BRIEF DESCRIPTION OF THE PRESENT INVENTION

With the foregoing considerations in mind, the present invention contemplates a greatly improved safety switch system for industrial machines wherein the risk of an operator developing carpal tunnel syndrome is substantially eliminated and wherein further the feature of providing two switches for simultaneous operation is also realized.

More particularly, in accord with the present invention, there is provided a touch plate switch responsive to contact with an operator's hand to generate a signal without any physical movement. A relay coil is provided and means within the touch plate switch responsive to the generated signal serves to energize the relay coil. A relay switch for the coil is operated upon energization of the relay coil to energize the industrial machine. With this arrangement, the industrial machine can be repeatedly energized with substantially no risk of the operator developing carpal tunnel syndrome.

In the preferred embodiment, two such touch plate switches are provided sufficiently spaced as to require both hands of the operator to effect simultaneous operation. The signals generated by each of the switches energize relay coils having corresponding relay switches in series between a power source and the industrial machine to be energized.

BRIEF DESCRIPTION OF THE DRAWINGS

A better understanding of this invention as well as further features and advantages thereof will be had by now referring to the accompanying drawings in which.

DETAILED DESCRIPTION OF THE PREFERRED EMBODIMENT

Figure 1:
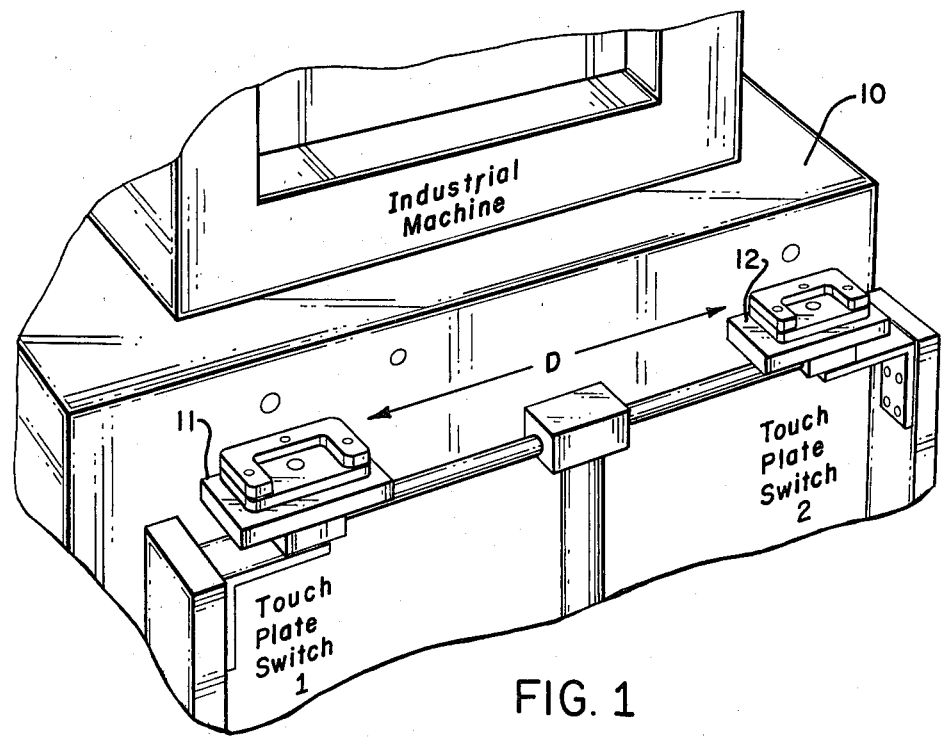
FIG. 1 is a fragmentary perspective view of the safety switch system of this invention for operating an industrial machine shown to the rear of the switches.

Referring first to FIG. 1, there is indicated by the numeral 10 an industrial machine which may constitute a punch press, radial saw, welding apparatus, or the like. Generally the particular machine involved is used in a manufacturing process or assembly line operation wherein it will repetitively by operated to shape or do other work on a particular part. Thus, an operator at the particular station involved, must repetitively start and stop the equipment. As mentioned heretofore, with the normally provided push buttons for starting the equipment, an operator after repetitive motions over a long period of time can easily develop carpal tunnel syndrome.

In accord with the present invention, the normal switches provided on the industrial machine are bypassed in favor of first and second touch plate switches indicated generally at 11 and 12, designed to be responsive to contact with an operator's hand to generate a signal without requiring any physical movement whatsoever of the touch plate. This signal is used to energize a relay coil which will in turn close a corresponding relay switch or contacts to provide power to the machine.

In the embodiment illustrated in FIG. 1, the relay switches associated with each of the relays energized by the particular first and second touch plate switches 11 and 12 are connected in series so that both switches must be simultaneously operated in order to start the machine. In other words, the operator must contact both of the touch plates 11 and 12 at the same time.

By separating these plates by the distance D as shown, it is not possible for the operator to bridge both switches with one hand. Rather, he must use both hands to operate the switches and therefore the desired safety feature of maintaining the operator's hands free of the machine when it is started is realized.

Figure 2:
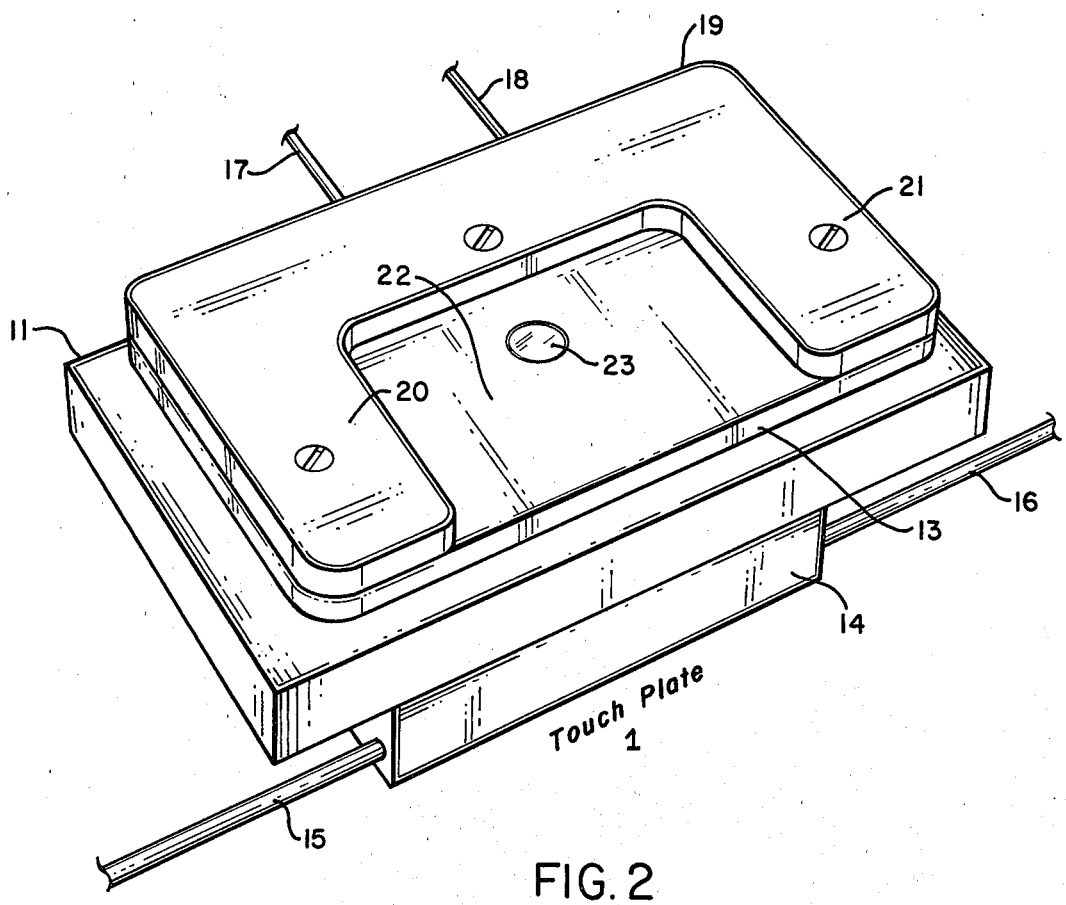
FIG. 2 is an enlarged perspective view of one of the switches illustrated in FIG. 1.

Referring now to FIG. 2, there is shown in perspective view the touch plate switch 11 in greater detail. The touch plate switch 12 is essentially the same as the touch plate switch 11 except for one electrical characteristic which will be described in detail subsequently. Accordingly, a detailed description of the switch 11 will suffice for both.

As shown in FIG. 2, the touch plate switch 11 includes a touch plate 13 disposed above a housing 14 incorporating an appropriate oscillating tuned circuit and amplifier and certain other electronic components to be described subsequently.

Power for the touch plate switch 11 is provided on leads 15 and 16. Output leads 17 and 18 in turn connect in series with an appropriate relay coil, as will also become clearer as the description proceeds. The arrangement is such that when the touch plate switch 11 is closed as by an operator contacting the touch plate 13, the output conductors 17 and 18 will be connected together.

In order to prevent inadvertent contact with the touch plate 13 by foreign objects or even by the operator when he does not intend to contact the same, there may optionally be provided a plastic U-shaped member 19 disposed on the top surface of the touch plate 13. The arms 20 and 21 of the U-shaped plastic member 19 define therebetween a touch area or surface 22 on the plate 13.

The assembly of FIG. 2 is completed by the provision of an indicator light 23 which will be energized when the switch operates to a closed position.

Figure 3:
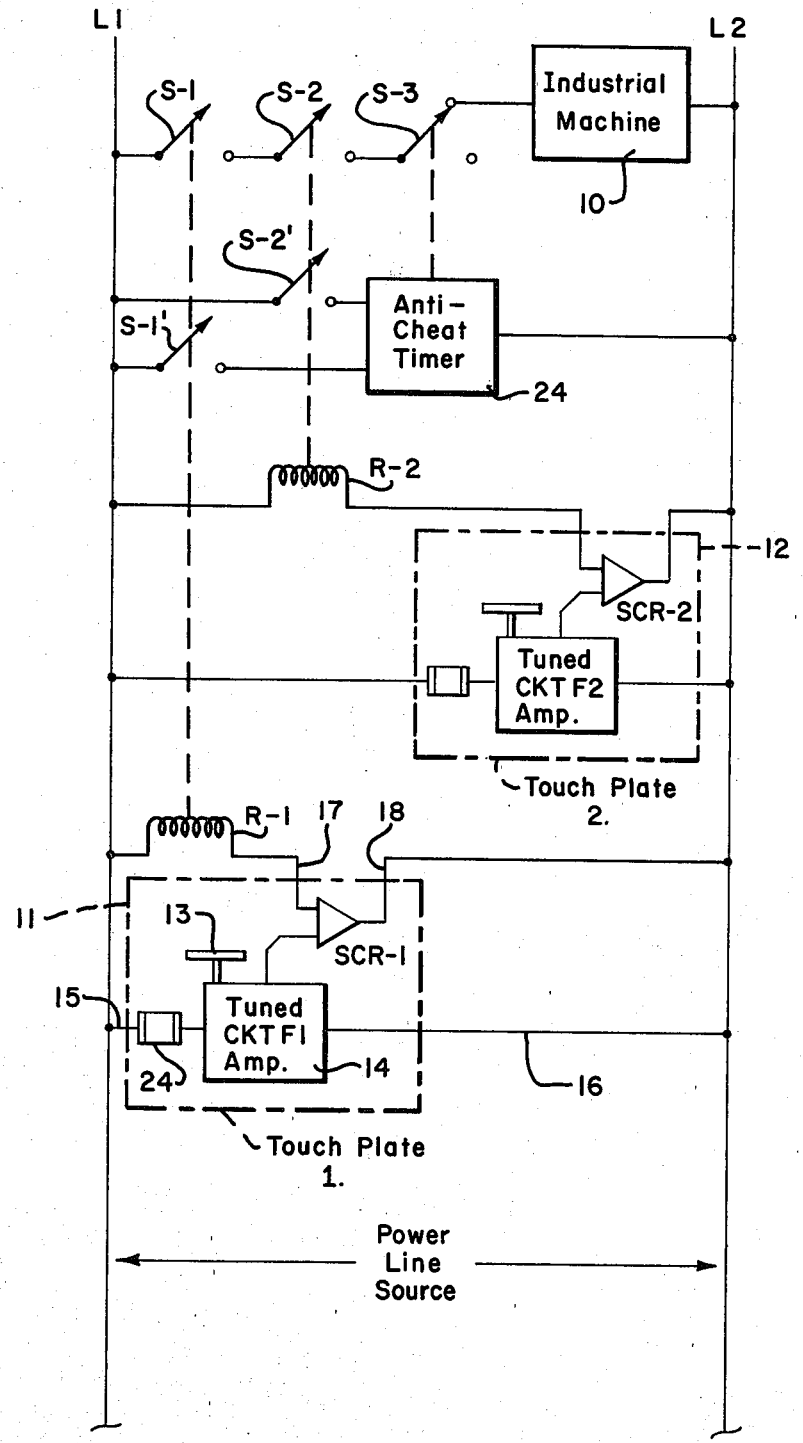
FIG. 3 is a highly schematic circuit diagram illustrating certain of the components described in FIGS. 1 and 2, useful in explaining the operation of this invention.

Referring now to FIG. 3, the manner in which the first and second touch plate switches 11 and 12 operate to energize the industrial machine 10 described in FIG. 1 will become evident.

In FIG. 3, there is shown on the left and right side of the drawing, power lines L1 and L2. A power source connects to the lower ends of these power lines as indicated in FIG. 3. Moving upwardly in FIG. 3 there is indicated by the dashed-dot line the first touch plate switch 11 wherein the power branch leads 15 and 16 connect the touch plate switch 11 across the power lines L1 and L2.

Also shown is the housing 14 which incorporates an oscillating tuned circuit and amplifier. The oscillating circuit is tuned to a frequency F1. The touch plate indicated at 13 connects to the tuned circuit such that when physical contact by an operator's hand or fingers is made with the touch plate, a change in capacitance and resistance across the tuned circuit occurs. This change gives rise to a signal change which is amplified to provide a trigger signal to fire the control terminal of a silicon control rectifier indicated at SCR-1 in FIG. 3.

When silicon control rectifier SCR-1 fires, it essentially results in a short circuit between the conductors 17 and 18, thereby effectively connecting these conductors together.

In FIG. 3, there is shown a first relay coil R-1 in series with the leads 17 and 18. Thus when SCR-1 fires, the relay coil R-1 will be energized. The circuit also includes a fuse 24.

Further upwardly on the diagram of FIG. 3 there is shown the second touch plate switch 12 wherein again there is provided an oscillating tuned circuit and amplifier together with a second silicon control rectifier SCR-2 and a fuse, all as shown. The circuit for the second touch plate switch is essentially the same as that for the first touch plate switch 11, except that the oscillating tuned circuit is tuned to a frequency F2 different from the frequency F1 for the tuned circuit of the first touch plate switch. The purpose for having a different frequency for the second touch plate switch is to avoid inadvertent operation as a consequence of operating the first switch. The only manner in which the second touch plate switch can be operated is for the operator to physically touch the touch plate to thereby give rise to a changed signal from the second oscillating tuned circuit in cooperation with the second silicon control rectifier SCR-2.

When the second rectifier avalanches to close the circuit, then a second relay coil R-2 is energized.

Energization of the first relay coil R-1 will close switches S-1 and S-1' while energization of the second relay coil R-2 will close relay switches S-2 and S-2'. Switches S-1 and S-2 and the industrial machine 10 are connected in series between the lines L1 and L2 as shown.

The circuit described in FIG. 3 can also include an anti-cheat timer device 24 which constitutes a simple timer to operate a relay which will open a switch S-3 in series with the relay switches S-1 and S-2 to de-energize the industrial machine 10 in the event that the time interval between closing of the first and second switches is greater than a given amount.

More particularly, with respect to the foregoing, the second set of switch arms S-1' and S-2' will close simultaneously with the relay switch arms S-1 and S-2. There will thus be introduced into the anti-cheat timer 24 signals at the time the respective relays are operated. The timer can simply measure the time interval between these signals and if it exceeds a given time interval by a given amount, as noted, then the switch arm S-3 is opened by the anti-cheat timer 24.

From the foregoing, it will now be appreciated that the required switches can be closed by a mere contact of an operator's hand with the touch plate on the appropriate switch without any physical movement of the touch plate being necessary. Accordingly, the operator's hand is not subject to the repetitive muscle strains and tendon tensions as occur when required to operate a pushbutton or other type of manual switch. Thus the risk of developing carpal tunnel syndrome is substantially eliminated.

In addition, by providing two switches in spaced relationship as described in FIG. 1, and also providing a circuit wherein both switches must be operated substantially simultaneously in order to energize the industrial machine, the further added safety feature of avoiding damage to a free arm of the operator is avoided.

From all of the foregoing, it will now be appreciated that the present invention has provided a greatly improved safety switch system for industrial machines.

What is claimed is:

1. A safety switch system for passing electrical power from a power source to an industrial machine, including, in combination:
   (a) first and second touch plate switches physically positioned adjacent to the industrial machine to be energized thereby at a spacing from each other sufficient that both switches cannot be operated simultaneously with one hand of an operator but require both hands of the operator, each of said touch plate switches including an oscillating tuned circuit and amplifier; a touch plate connected to said oscillating tuned circuit, said oscillating tuned circuit being responsive to touching of the plate by an operator's hand to result in a signal change from said oscillating tuned circuit, said amplifier generating a trigger signal in response to said signal change, the frequency of the oscillating tuned circuit in said first touch plate switch being different from the frequency of said oscillating tuned circuit in the second touch plate switch; and a silicon controlled rectifier having its control terminal connected to receive said trigger signal;

(b) first and second relay switches connected in series with each other between said power source and machine;

(c) first and second relay coils respectively connected in circuit with the silicon control rectifiers of the first and second touch plate switches so as to be energized in response to firing of the silicon control rectifiers respectively whereby power cannot be passed to said industrial machine from said power source unless both said relay switches are closed and whereby operation of either one of said touch plate switches does not require any physical movement of the associated touch plate itself so that the risk of an operator developing carpal tunnel syndrome is substantially eliminated; and (d) third and fourth relay switches connected to said first and second relay coils, respectively, to open and close simultaneously with the opening and closing of said first and second relay switches, respectively;

(e) an anti-cheat timer connected to said third and fourth relay switches to measure the time interval between the closing of said third and fourth relay switches; and (f) a fifth relay switch connected in series with said first and second relay switches, said fifth relay switch also connected to said anti-cheat timer such that if the time interval between the closing of said third and fourth relay switches exceeds a predetermined amount said fifth relay switch is opened thereby opening the circuit to said industrial machine.

2. A system according to claim 1, including a U-shaped plastic member secured to the top of each touch plate to define between the arms of the U a touch area on the plate and thereby minimize the risk of inadvertent operation of the touch plate switch.

* * * * *